US010249671B2

(12) United States Patent
Peizerat

(10) Patent No.: US 10,249,671 B2
(45) Date of Patent: Apr. 2, 2019

(54) LOW-NOISE CMOS IMAGE SENSOR

(71) Applicant: Commissariat à l'Énergie Atomique et aux Énergies Alternatives, Paris (FR)

(72) Inventor: Arnaud Peizerat, Grenoble (FR)

(73) Assignee: Commissariat à l'Énergie Atomique et aux Énergies Alternatives, Paris (FR)

( * ) Notice: Subject to any disclaimer, the term of this patent is extended or adjusted under 35 U.S.C. 154(b) by 0 days.

(21) Appl. No.: 15/810,342

(22) Filed: Nov. 13, 2017

(65) Prior Publication Data
US 2018/0138226 A1 May 17, 2018

(30) Foreign Application Priority Data
Nov. 16, 2016 (FR) ...................... 16 61107

(51) Int. Cl.
H04N 5/363 (2011.01)
H04N 5/374 (2011.01)
H01L 27/146 (2006.01)

(52) U.S. Cl.
CPC .. *H01L 27/14634* (2013.01); *H01L 27/14614* (2013.01); *H01L 27/14643* (2013.01); *H04N 5/363* (2013.01); *H04N 5/374* (2013.01)

(58) Field of Classification Search
CPC ......... H01L 27/14643; H01L 27/14601; H01L 27/14612; H01L 27/14614; H04N 5/357
See application file for complete search history.

(56) References Cited

U.S. PATENT DOCUMENTS

| 2006/0202242 | A1 | 9/2006 | Takagi et al. |
| 2008/0296645 | A1 | 12/2008 | Itonaga |
| 2009/0290058 | A1 | 11/2009 | Miyagawa |
| 2014/0103412 | A1* | 4/2014 | Lee ................... H01L 27/14605 |
| | | | 257/292 |

(Continued)

FOREIGN PATENT DOCUMENTS

| EP | 2 574 043 A2 | 3/2013 |
| EP | 2 966 687 A1 | 1/2016 |
| WO | WO 2005/096384 A1 | 10/2005 |

OTHER PUBLICATIONS

European Search Report for Application No. EP 17 20 0203 dated Apr. 11, 2018.

(Continued)

*Primary Examiner* — Changhyun Yi
(74) *Attorney, Agent, or Firm* — Wolf, Greenfield & Sacks, P.C.

(57) ABSTRACT

A CMOS pixel including a photodiode having a terminal connected to a potential GND and another terminal connected to a sense node by a first MOS transistor; a second MOS transistor connecting the sense node to a potential VDDH; and a third MOS transistor having its gate connected to the sense node, the transistors having a same gate insulator thickness, wherein the third transistor has a gate length and/or width smaller than those of the first and second transistors, wherein difference VDDH-GND is greater than the nominal voltage of the third MOS transistor, and wherein the body or drain region of the third transistor is connected to a potential VL between potentials VDDH and GND.

13 Claims, 1 Drawing Sheet

(56) References Cited

U.S. PATENT DOCUMENTS

2015/0041865 A1* 2/2015 Storm .................... H04N 5/355
                                                    257/229
2017/0295338 A1* 10/2017 Geurts ................... H04N 5/363
2018/0138226 A1* 5/2018 Peizerat ............ H01L 27/14614

OTHER PUBLICATIONS

Preliminary Search Report for French Application No. 1661107 dated Aug. 25, 2017.

* cited by examiner

LOW-NOISE CMOS IMAGE SENSOR

This application claims the priority benefit of French patent application number 16/61107, filed Nov. 16, 2016, the content of which is hereby incorporated by reference in its entirety to the maximum extent allowable by law.

BACKGROUND

The present disclosure relates to the field of CMOS image sensors. It particularly aims at a low-noise CMOS image sensor, capable of operating in low luminosity conditions.

DISCUSSION OF THE RELATED ART

Conventionally, a CMOS image sensor comprises pixels arranged in an array of rows and columns. Each pixel comprises a photodiode used in reverse mode, having its junction capacitance discharged by a photocurrent according to a received light intensity. At the end of a period, called image acquisition or integration period, before and after which the pixel is reset by recharging of its photodiode, the photogenerated charges stored in the photodiode are transferred to a capacitive sense node of the pixel. The illumination level received by the pixel is measured by measuring the potential variation of the pixel sense node, caused by the transfer, onto this node, of the charges photogenerated in the photodiode of the pixel.

In practice, various noise sources are capable of affecting the measurement, which may raise an issue when the quantity of charges photogenerated in the photodiode is small, particularly when the sensor is used in low brightness conditions.

There is a need for a CMOS image sensor overcoming all or part of the disadvantages of existing sensors. More particularly, there is a need for a low-noise CMOS image sensor, capable of operating in low brightness conditions.

SUMMARY

Thus, an embodiment provides a CMOS image sensor comprising at least one pixel comprising:

a photodiode having a first terminal connected to a node of application of a first reference potential;

a first MOS transistor connecting a second terminal of the photodiode to a sense node of the pixel;

a second MOS transistor connecting the sense node to a node of application of a second reference potential; and a third MOS transistor assembled as a source follower having its gate connected to the sense node and having its source intended to be connected to a readout circuit, the first, second, and third transistors having a same gate insulator thickness, wherein the third transistor has a gate length smaller than the gate lengths of the first and second transistors and/or a gate width smaller than the gate widths of the first and second transistors, the difference between the first and second reference potentials is greater than the maximum voltage which may be applied between two terminals of the third MOS transistor, and the body region or the drain region of the third transistor is connected to a node of application of a third reference potential between the first and the second potentials.

According to an embodiment, the body region of the third transistor is insulated from the body region of the first transistor and the third reference potential applied to the body region of the third transistor is different from the potential applied to the body region of the first transistor.

According to an embodiment, the third transistor is a P-channel transistor.

According to an embodiment, the first and second transistors are N-channel transistors, the body regions of the first and second transistors being connected to the node of application of the first reference potential, the body region of the third transistor being connected to the node of application of the second reference potential, and the drain region of the third transistor being connected to the node of application of the third reference potential.

According to an embodiment, the pixel further comprises a fourth MOS transistor connecting the source of the third transistor to an output track of the pixel.

According to an embodiment, the fourth transistor has a gate length greater than that of the third transistor and/or a gate width greater than that of the third transistor.

According to an embodiment, the fourth transistor is a transistor of the same conductivity type as the third transistor.

According to an embodiment, the photodiode is a pinned diode comprising an N-type doped storage region, formed in a P-type doped substrate, and a P-type doped layer coating the storage region, said layer having a higher doping level than the substrate.

According to an embodiment, the first, second, and third transistors are N-channel transistors, the body regions of the first and second transistors being connected to the node of application of the first reference potential, the body region of the third transistor being connected to the node of application of a fourth reference potential, and the drain region of the third transistor being connected to a node of application of a fifth reference potential.

According to an embodiment, the sensor is formed with a technological process enabling to form on a same chip MOS transistors having a first gate insulator thickness and MOS transistors having a second gate insulator thickness greater than the first thickness, and the first, second, and third transistors have the second gate insulator thickness.

According to an embodiment, the sensor further comprises a peripheral control circuit comprising at least one MOS transistor having a gate insulator thickness smaller than that of the first, second, and third transistors.

The foregoing and other features and advantages will be discussed in detail in the following non-limiting description of specific embodiments in connection with the accompanying drawings.

DETAILED DESCRIPTION

Figure 1:
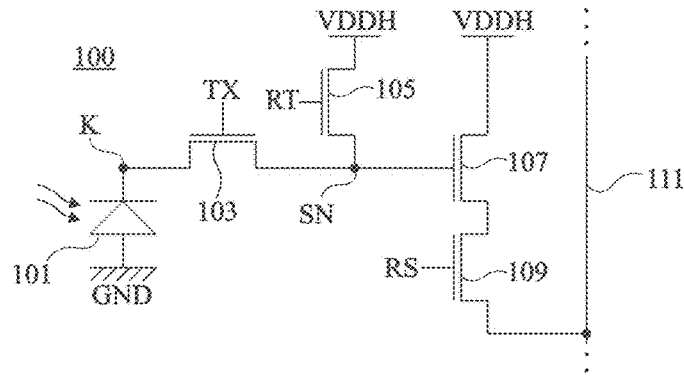
FIG. 1 is an electric diagram of an example of a pixel of a CMOS image sensor.

The same elements have been designated with the same reference numerals in the various drawings and, further, the various drawings are not to scale. For clarity, only those steps and elements which are useful to the understanding of the described embodiments have been shown and are detailed. In particular, the peripheral circuits for reading out and controlling the described image sensors have not been detailed, the forming of such circuits being within the abilities of those skilled in the art based on the functional indications of the present description. In the following description, when reference is made to terms qualifying an absolute position, such as terms "front", "back", etc., or a relative position, such as terms "above", "under", "upper", "lower", etc., reference is made to the orientation of the cross-section views of FIGS. 2 and 4, it being understood that, in practice, the described devices may be oriented differently. Unless otherwise specified, expressions "approximately", "substantially", and "in the order of" mean to within 10%, preferably to within 5%.

FIG. 1 is an electric diagram showing an example of a pixel 100 of a CMOS image sensor. Pixel 100 comprises a photodiode 101, a storage node K formed by the cathode of photodiode 101, and a sense node SN. The anode of photodiode 101 is connected to a node of application of a low reference potential GND, for example, the ground. Pixel 100 further comprises a transfer transistor 103 having its conduction nodes (source/drain) respectively connected to node K and to node SN, a reset transistor 105 having its conduction nodes respectively connected to node SN and to a node of application of a high reference potential VDDH, a readout transistor 107 assembled as a source follower, having its gate connected to node SN and having its drain connected to a node of application of a reference potential, and a selection transistor 109 having its conduction nodes respectively connected to the source of readout transistor 107 and to an output conductive track 111, generally called column, which may be common to a plurality of sensor pixels.

In the shown example, transistors 103, 105, 107, and 109 are N-channel MOS transistors, and transistor 107, assembled as a source follower (or common drain assembly), has its drain connected to a node of application of a high reference potential, potential VDDH in this example.

In operation, the potential variations of node SN are transferred to the source of transistor 107 in a substantially identical form, that is, with no amplification or with a gain in the order of 1. Pixel 100 receives control signals TX, RT, and RS respectively applied to the gates of transistors 103, 105, and 109.

As an example, pixel 100 may be controlled as follows:

During a pixel integration phase (preceded by a step of resetting photodiode 101), transfer transistor 103 may be kept non-conductive (signal TX in the low state in the present example) to isolate storage node K from sense node SN. The electric charges generated in photodiode 101 under the effect of light then cause a progressive decrease of the voltage of node K.

Before the end of the integration phase, reset transistor 105 may be turned on (signal RST in a high state in this example) to reset the potential of sense node SN to potential VDDH, after which transistor 105 may be turned off to isolate node SN from node VDDH.

After the step of resetting node SN, the potential of node SN may be read and stored in a first read step, to be used as a reference for a subsequent step of measuring the discharge level of the photodiode. To achieve this, selection transistor 109 is turned on (signal RS in a high state in this example), so that the potential of node SN is transferred to output track 111, via transistors 107 and 109. The potential of track 111 may then be read and stored, via a readout circuit, not shown.

After the first reading step, transfer transistor 103 may be turned on (signal TX in the high state in this example) to cause the transfer of the photogenerated charges stored in the photodiode onto sense node SN. The voltage at node SN then decreases by a value representative of the amount of photogenerated charges stored in the photodiode, and thus of the light intensity received by the photodiode during the integration.

The potential of node SN, transferred onto output track 111 by transistors 107 and 109, can then be read again during a second readout step, by a readout circuit, not shown.

The output value of the pixel is for example equal to the difference between reference potential $V_{OUT1}$ read out from track 111 during the first readout step and potential $V_{OUT2}$ read out from track 111 during the second readout step.

An advantage of such a readout method, generally called CDS in the art, for "Correlated Double Sampling", is that it enables to at least partly do away with certain sources of noise, such as the reset noise introduced by transistor 105.

Other readout methods may be used to decrease the noise, for example, a readout method of the type generally called CMS in the art, for "Correlated Multiple Sampling", comprising integrating a plurality of successive samples of the output value of the pixel, which enables to increase the signal-to-noise ratio.

Figure 2:
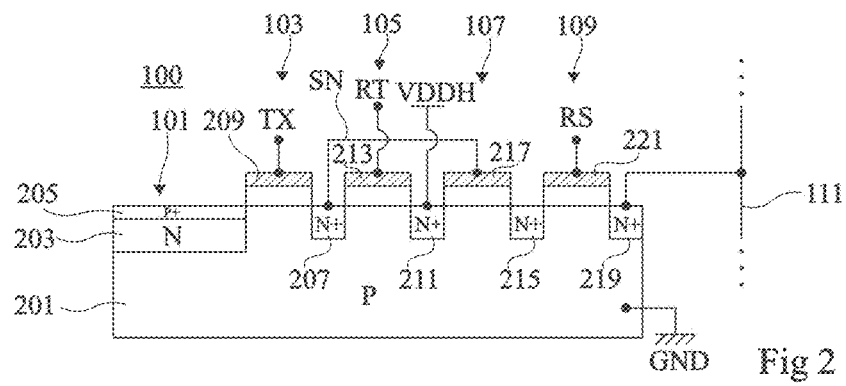
FIG. 2 is a simplified cross-section view of the pixel of FIG. 1.

FIG. 2 is a simplified cross-section view illustrating an embodiment of pixel 100 of FIG. 1. In this example, pixel 100 is formed inside and on top of a portion of a P-type doped semiconductor substrate 201 (for example, made of silicon).

Photodiode 101 is formed close to the upper surface or front surface of substrate 201, and comprises an N-type doped region 203, topped with a P-type doped region 205 having a higher doping level than substrate 201. Region 203 defines a photogenerated charge storage area. In this example, photodiode 101 is a so-called pinned photodiode, or buried photodiode. In the absence of photogenerated charges, the potential of storage region 203 is defined by the doping levels of regions 201, 203, and 205, and is for example equal to 1.5 V. The use of a pinned diode enables to significantly decrease the pixel noise, and more particularly the noise due to dark currents and the reset noise.

Transistor 103 comprises an N-type doped region 207, for example having a higher doping level than region 203, separated from photodiode 101 by a region of substrate 201, and an insulated gate 209 coating the surface of substrate 201 between photodiode 101 and region 207. Region 207 defines the drain of transistor 103, and region 203 defines the source of transistor 103. The portion of substrate 201 located under gate 209, between regions 203 and 207, defines the body region (also called "well"), or channel-forming region, of transistor 103.

Transistor 105 comprises an N-type doped region 211, for example having the same doping level as region 207, separated from region 207 by a portion of substrate 201, and an insulated gate 213 coating the surface of substrate 201 between region 207 and region 211. Region 207 defines the source of transistor 105, and region 211 defines the drain of transistor 105. The portion of substrate 201 located under gate 213, between regions 207 and 211, defines the body region, or channel-forming region, of transistor 105.

Transistor 107 comprises an N-type doped region 215, for example having the same doping level as region 207, separated from region 211 by a portion of substrate 201, and an insulated gate 217 coating the surface of substrate 201 between region 211 and region 215. Region 215 defines the source of transistor 107, and region 211 defines the drain of transistor 107. The portion of substrate 201 located under gate 217, between regions 211 and 215, defines the body region, or channel-forming region, of transistor 107.

Transistor 109 comprises an N-type doped region 219, for example having the same doping level as region 207, separated from region 215 by a portion of substrate 201, and an insulated gate 221 coating the surface of substrate 201 between region 215 and region 219. Region 219 defines the source of transistor 109, and region 215 defines the drain of transistor 109. The portion of substrate 201 located under gate 221, between regions 215 and 219, defines the body region, or channel-forming region, of transistor 109.

In this example, gate 209 of transistor 103 is connected to a node of application of signal TX, gate 213 of transistor 105 is connected to a node of application of signal RT, gate 217 of transistor 107 is connected to node SN, gate 221 of transistor 109 is connected to a node of application of signal RS, region 207 is connected to node SN, region 211 is connected to a node of application of high reference potential VDDH, substrate 201 (and accordingly, the anode of diode 101 as well as the body regions of transistors 103, 105, 107, and 109) is connected to a node of application of low reference potential GND, and region 219 is connected to output track 111.

A noise source which raises an issue in low illumination level applications is the readout noise generated by the readout transistor assembled as a source follower, and more particularly the 1/f component of the readout noise, also called flickering noise. Such a noise source indeed remains significant even when a reading of CDS or CMS type is implemented, and may become preponderating in low brightness conditions.

Patent application EP2966687 previously filed by the applicant teaches that variance $\overline{Q^2}$ (in [Coulomb$^2$]) of the 1/f component of the input-referred readout noise, introduced by the readout transistor assembled as a source follower can be expressed as follows:

$$\overline{Q^2} = \alpha_{CMS} \frac{K}{C_{ox}^2 WL}(C_{SN} + c_{GS}WL + c_{GD}W)^2, \quad (1)$$

K being a parameter proportional to kT depending on the considered technology (where k is Boltzmann's constant and T is the absolute temperature), $\alpha_{CMS}$ being a noise reduction factor independent from the pixel structure and only depending on the product of the circuit bandwidth by the time separating the successive sample readout steps (in the case of a CMS-type reading), as well as on the number of samples accumulated to generate the pixel output value, $C_{ox}$ being the gate-substrate surface capacitance formed by the gate oxide of the readout transistor assembled as a source follower, W and L respectively being the gate width (dimension orthogonal to the source-drain current circulation direction) and the gate length (dimension parallel to the source-drain current circulation direction) of the readout transistor, $C_{SN}$ being the capacitance of sense node SN, particularly depending on the stray capacitances of the reset transistor and of the transfer transistor, and $c_{GS}$ and $c_{GD}$ respectively being the gate-source surface capacitance and the gate-drain linear capacitance of the readout transistor.

To decrease the 1/f component of the readout noise, the above-mentioned patent application EP2966687 provides a pixel where the readout transistor assembled as a source follower has a gate oxide thickness smaller than that of the other pixel transistors.

Indeed, in a given CMOS integrated circuit chip manufacturing process, two different gate oxide thicknesses are generally available to form MOS transistors. Conventionally, in an image sensor comprising pixels with four MOS transistors of the type described in relation with FIGS. 1 and 2, the four transistors of the pixel (transistors 103, 105, 107, and 109) are thick-oxide transistors. Thick-oxide transistors may indeed operate at nominal voltages greater than the nominal operating voltages of thin-oxide transistors, and thus enable to form pixels having a larger dynamic range (or measurement range). The use of thick oxide transistors is particularly adapted when the photodiode is a pinned photodiode of the type described in relation with FIG. 2. This type of photodiode indeed has a no-charge voltage (in the absence of photogenerated charges) which may be relatively high, for example, close to the nominal operating voltage of thin oxide MOS transistors. Only using thin-oxide transistors would then not enable to obtain a sufficient dynamic operating range for the pixel.

The pixel described in patent application EP2966687 comprises a photodiode, a sense node, a transfer transistor, a reset transistor, and a readout transistor assembled as a source follower, the transfer transistor and the reset transistor being thick-oxide transistors, and the readout transistor being a thin-oxide transistor. The use of a thin-oxide readout transistor enables to increase the gate-substrate surface capacitance $C_{ox}$ formed by the gate oxide of the readout transistor with respect to a pixel where all the transistors are thick-oxide transistors. This enables to significantly decrease the 1/f component of the pixel readout noise. Further, an additional advantage is that thin oxide MOS transistors may be sized to have a gate surface area (WL) smaller than the minimum gate surface area which may be given to thin-oxide transistors. This here again contributes to decreasing the 1/f component of the readout noise (as appears from the above equation (1) where surface area WL is squared at the numerator).

In above-mentioned patent application EP2966687, to avoid having a decreased dynamic range with respect to a pixel where all transistors are thick-oxide transistors, the body region of the readout transistor is insulated from the body regions of the transfer and reset transistors. The body and drain regions of the readout transistor are biased so that the readout transistor can receive on its gate the entire potential swing of sense node SN (from the reset potential to the saturation potential of the pixel), without for the gate-drain or gate-body voltage of the readout transistor to exceed the nominal operating voltage VDDL of a thin-oxide MOS transistor. The body and drain regions of the readout transistor are for example biased so that the body-drain voltage of the readout transistor is equal to the nominal operating voltage VDDL of thin oxide MOS transistors. The transfer and reset transistors remain biased to a voltage preferably equal to the nominal operating voltage VDDH of thick-oxide MOS transistors to maximize the range of possible measurement values.

The solution described in the above-mentioned patent application EP2966687 however has shortcomings, particularly in advanced CMOS manufacturing processes, typically in processes where the shortest MOS transistor gate length which can be achieved is shorter than or equal to 130 nm.

Indeed, the inventors have observed that, in advanced processed, the pixel described in patent application EP2966687 is submitted not only to the above-mentioned 1/f noise, but also to another noise source that could be neglected in prior processes, which is due to the flowing of a leakage current through the gate oxide of the readout transistor assembled as a source follower. Such a leakage noise, also called "shot noise", is due to the significant decrease of the gate oxide thickness of thin oxide transistors in advanced technologies, which results in the flowing of a current by tunnel effect from sense noise SN to the body and/or the drain of the readout transistor, through the gate oxide of the readout transistor. Variance $Q^2$ (in [Coulomb$^2$]) of the input-referred shot noise, introduced by the readout transistor assembled as a source follower, may be expressed as follows:

$$\overline{Q^2} = 2\alpha_{shot} q I_L T_S \quad (2),$$

$I_L$ being the average value of the total leakage current through the gate oxide of the readout transistor, q being the charge in electrons on the sense node, $T_S$ being the time between successive readout steps of the correlated multiple sampling readout method, and $\alpha_{shot}$ being a constant parameter which is a function of number M of successive readout steps of the correlated multiple sampling readout method (substantially equal to 0.5 for M=2, that is, in the case of a correlated double sampling readout).

The shot noise adds to the above-mentioned 1/f noise, expressed by equation (1).

According to the considered technological process, the shot noise may become significant, or even preponderating, thus canceling the above-described advantages linked to the use of a thin-oxide readout transistor.

According to an aspect of an embodiment, a pixel comprising a photodiode, a sense node, a transfer transistor, a reset transistor, and a readout transistor assembled as a source follower is provided, where the transfer transistor, the reset transistor, and the readout transistor substantially have the same gate oxide thickness, and where the readout transistor has a gate length L shorter than the smallest of the gate lengths of the transfer and reset transistors, and/or a gate width W shorter than the smallest of the gate widths of the transfer and reset transistors.

The provision of a readout transistor having dimensions L and/or W decreased with respect to those of the transfer and reset transistors enables to decrease the 1/f component of the pixel readout noise. Preferably, the transistors are thick-oxide transistors, which further enables to significantly decrease the readout noise component due to the leakage in the gate oxide of the readout transistor, and even to make it negligible.

In a given CMOS-technology integrated circuit chip manufacturing process, for a given gate oxide thickness, and for a given nominal operating voltage, there conventionally exists a minimum gate length $L_{min}$ and a minimum gate width $W_{min}$ below which it should not be decreased, to avoid risking a breakdown of the transistor.

According to an aspect, it is here provided to give the pixel readout transistor a gate length L smaller than the minimum gate length $L_{min}$ that the transfer and reset transistors can accept at their nominal operating voltage VDDH, and/or a gate width W shorter than the minimum gate width $W_{min}$ that the transfer and reset transistors can accept at their nominal operating voltage VDDH. The maximum voltage VDDL' that the readout transistor can withstand, or nominal operating voltage of the readout transistor, is then smaller than the nominal operating voltage VDDH of the transfer and reset transistors.

To avoid decreasing the dynamic range with respect to a pixel where all transistors are thick-oxide transistors and can operate at voltage VDDH, the body region of the readout transistor is insulated from the body regions of the transfer and reset transistors. The body and drain regions of the readout transistor are biased so that the readout transistor can receive on its gate the entire potential swing of sense node SN (from the reset potential to the saturation potential of the pixel), without for the gate-drain or gate-body voltage of the readout transistor to exceed voltage VDDL'. The body and drain regions of the readout transistor are for example biased so that the body-drain voltage of the readout transistor is equal to voltage VDDL'. The transfer and reset transistors remain biased to a voltage preferably equal to their nominal operating voltage VDDH, to maximize the range of possible measurement values.

Figure 3:
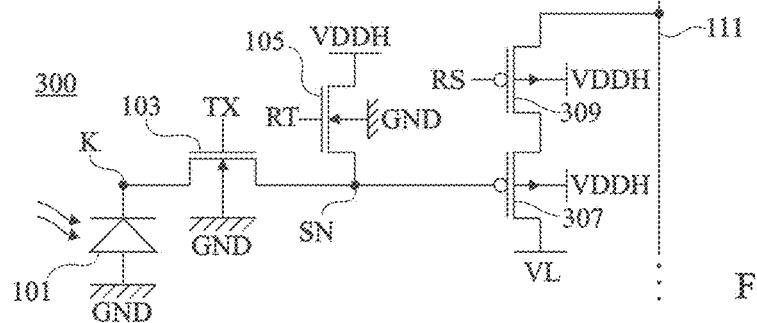
FIG. 3 is an electric diagram of an embodiment of a CMOS image sensor pixel.

FIG. 3 is an electric diagram of an embodiment of a pixel 300 of a CMOS image sensor. Pixel 300 comprises, like pixel 100 of the example of FIG. 1, a photodiode 101, a storage node K formed by the cathode of photodiode 101, and a sense node SN. The anode of photodiode 101 is connected to a node of application of a low reference potential GND, for example, the ground. Pixel 300 further comprises, as in the example of FIG. 1, a transfer transistor 103 connecting node K to node SN, and a reset transistor 105 connecting node SN to a node of application of a high reference potential VDDH. Pixel 300 further comprises a readout transistor 307 assembled as a source follower, having its gate connected to node SN and having its drain connected to a node of application of an intermediate reference voltage VL, and a selection transistor 309 having its conduction nodes respectively connected to the source of readout transistor 307 and to an output conductive track 111, which may be common to a plurality of pixels of the sensor.

In the shown example, transistors 103 and 105 are N-channel MOS transistors, and transistors 307 and 309 are P-channel MOS transistors. In this example, transistors 103, 105, 307, and 309 are thick-oxide transistors. Transistors 103 and 105 have dimensions W and L such that they can withstand with no degradation bias voltage VDDH of the pixel. In other words, the nominal operating voltage of transistors 103 and 105 is greater than or equal to bias voltage VDDH of the pixel. Transistor 307 however has a decreased gate length and/or a decreased gate width, whereby the maximum voltage VDDL' that transistor 307 can withstand is smaller than bias voltage VDDH of the pixel.

Transistors 103 and 105 have their body regions connected to a node of application of low reference potential GND, and transistors 307 and 309 have their body regions connected to a node of application of high reference potential VDDH. Readout transistor 307 has its drain connected to a node of application of an intermediate reference potential VL, between low reference potential GND and high reference potential VDDH. As a variation, the body region of readout transistor 307 may be connected to the source of this same transistor.

In operation, the potential variations of node SN are transferred to the source of transistor 307 in a substantially identical form. Pixel 300 receives control signals TX, RT, and RS respectively applied to the gates of transistors 103, 105, and 309.

As an example, pixel 300 may be controlled substantially in the same way as pixel 100 of FIG. 1, the level of the logic signals being adapted according to the conductivity type of the transistors.

Voltage VDDH (relative to ground GND) is for example substantially equal to the nominal operating voltage of transistors 103 and 105. The intermediate potential VL applied to the drain of transistor 307 may be selected so that, in normal conditions of use of the pixel, transistor 307 never sees a voltage greater than the maximum voltage VDDL'

(relative to ground) that it can withstand, taking into account the decrease of its dimensions. As an example, voltage difference VDDH-VL corresponds to the nominal operating voltage VDDL' of transistor 307.

As a (non-limiting) illustration, a technological process is considered, where thick oxide MOS transistors are provided to operate up to voltages which may range up to 3.3 V, provided for their gate length not to be shorter than a value $L_{min}=0.5$ µm and for their gate width not to be shorter than a value $W_{min}$ smaller than 0.4 µm. It is then provided to give transistor 307 a gate length in the order of 0.3 µm and a gate width in the order of 0.3 µm, whereby the maximum voltage that transistor 307 can withstand is in the order of 2.5 V. Low reference potential GND is for example equal to 0 V and high reference potential VDDH is equal to 3.3 V. The intermediate reference potential VL applied to the drain of readout transistor 307 is then selected to be greater than or equal to 0.8 V so that transistor 307 never sees a voltage greater than 2.5 V between any two of its four terminals (gate, source, drain, body).

If no-charge voltage Vpin of the photodiode is of the same order of magnitude as nominal power supply voltage VDDL' of transistor 307, then the variation range of potential $V_{SN}$ (or voltage relative to ground) of the sense node has an amplitude substantially equal to VDDL'. More specifically, potential $V_{SN}$ varies between a value Vpin and the maximum reset voltage of node SN, which is VDDH-$V_{tn}$, where $V_{tn}$ is the threshold voltage of the reset NMOS transistor. If the variation amplitude at node SN, equal to VDDH-$V_{tn}$-Vpin, is smaller than voltage VDDL', it is then possible to find a reference potential VL of the readout transistor which enables to respect the maximum voltage accepted across the readout transistor.

Selection transistor 309 is preferably a MOS transistor having dimensions greater than or equal to the minimum dimensions $W_{min}$ and $L_{min}$ to be respected to withstand VDDH. Indeed, the use of a selection transistor having decreased dimensions would require controlling the gate of this transistor with a control voltage having a controlled swing to avoid damaging the transistor. In the case of the example described hereabove in relation with FIG. 3, the control voltage of the gate of selection transistor 309, if the latter has decreased dimensions such that its nominal operating voltage is equal to VDDL', may for example oscillate between a low level equal to reference potential VL and high reference potential VDDH. The implementation of such a control however makes the forming of peripheral circuits for controlling the sensor more complex.

Further, it is preferable for selection transistor 309 to be of the same conductivity type as readout transistor 307, so that the potential level present on the source of the readout transistor is properly transmitted over output conductive track 111 of the pixel.

Figure 4:
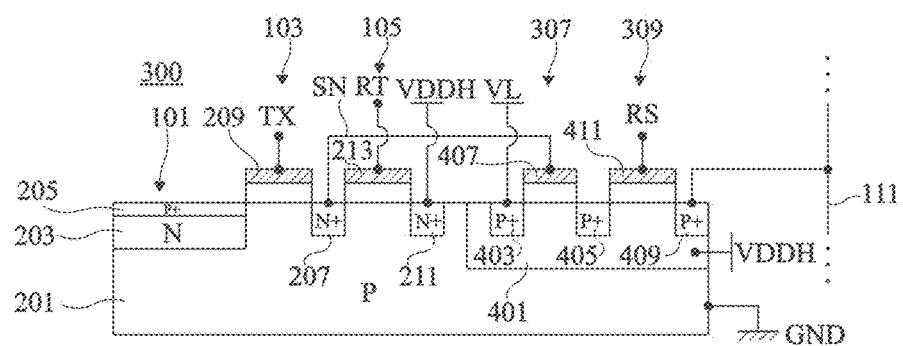
FIG. 4 is a simplified cross-section view illustrating an embodiment of the pixel of FIG. 3.

FIG. 4 is a simplified cross-section view illustrating an embodiment of pixel 300 of FIG. 3. In this example, pixel 300 is formed inside and on top of a portion of a P-type doped semiconductor substrate 201 (for example, made of silicon). Photodiode 101, transistor 103, and transistor 105 are substantially identical to what has been described in relation with FIG. 2, and transistors 307 and 309 are formed in a same N-type doped well 401, formed in an upper portion of substrate 201.

Transistor 307 comprises two P-type doped regions 403 and 405, formed in an upper portion of well 401 and separated by a portion of well 401. Transistor 307 further comprises an insulated gate 407 coating the surface of well 401 between region 403 and region 405. Region 403 defines the drain region of transistor 307, and region 405 defines the source region of transistor 307. The portion of well 401 located under gate 407, between regions 403 and 405, defines the body region, or channel-forming region, of transistor 307.

Transistor 309 comprises a P-type doped region 409, for example, of same doping level as regions 403 and 405, separated from region 405 by a portion of well 401, and an insulated gate 411 coating the surface of well 401 between region 405 and region 409. Region 405 defines the drain region of transistor 309 and region 409 defines the source region of transistor 309. The portion of well 401 located under gate 411, between regions 405 and 409, defines the body region, or channel-forming region, of transistor 309.

In this example, gate 209 of transistor 103 is connected to a node of application of signal TX, gate 213 of transistor 105 is connected to a node of application of signal RT, gate 407 of transistor 307 is connected to node SN, gate 411 of transistor 309 is connected to a node of application of signal RS, region 207 is connected to node SN, region 211 is connected to a node of application of high reference potential VDDH, substrate 201 (and accordingly the anode of diode 103 as well as the body regions of transistors 103 and 105) is connected to a node of application of low reference potential GND, well 401 (and accordingly, the body regions of transistors 307 and 309) is connected to a node of application of high reference potential VDDH, region 403 is connected to a node of application of intermediate reference potential VL, and region 409 is connected to output track 111.

In the shown example, transistors 103, 105, and 309 substantially have the same gate length, greater than the gate length of transistor 307.

Advantageously, in the case of an image sensor with a plurality of pixels, neighboring pixels may share a same well 401 where transistors 307 and 309 are formed, which enables to decrease the sensor bulk.

Specific embodiments have been described. Various alterations, modifications, and improvements will readily occur to those skilled in the art.

In particular, it will be within the abilities of those skilled in the art to adapt the described embodiments to the case where the readout transistor assembled as a source follower is an N-type MOS transistor. In this case, the body region of the readout transistor may be insulated from the body region of the transfer and reset transistors by means of a triple-well structure, to be able to insulate the body region of the readout transistor from substrate 201, to be able to bias them to different voltages. The body region of the readout transistor may then be connected to a node of application of an intermediate reference potential VrefLow which is preferably smaller than or equal to the minimum voltage capable of being present on the transistor source, that is, Vpin-Vt1 (where Vt1 is the threshold voltage of the readout transistor of decreased dimensions), for example, 1.5 V-0.5 V=1 V. The drain region of the readout transistor is then connected to a node of application of a reference potential VrefHigh, which preferably does not exceed VrefLow+VDDL'. Reference potentials VrefLow and VrefHigh are thus preferably selected so that the readout transistor never sees between its terminals a voltage greater than voltage VDDL'.

Such an embodiment with an NMOS-type readout transistor requires using a triple-well structure which is bulky and decreases the pixel density. Further, in practice, two voltage references VrefLow and VrefHigh, different from the power supply voltages and from ground, may appear to be necessary to respect the voltage constraints of the transistor of decreased dimensions. For this last point, it may be envisaged to bias the drain of reset transistor 105 to the same voltage VrefHigh as that applied to the drain of the NMOS selection transistor since the maximum level capable of flowing through the NMOS transistor is equal to VDDH−Vtn2 (Vtn2 being the threshold voltage of the reset NMOS transistor), that is, for example, 3.3 V−0.5 V=2.8 V.

Further, the inventors have observed that, in practice, the use of an NMOS transistor as a readout transistor does not provide the same good results for 1/f noise as with a PMOS transistor.

Thus, in the case of a pinned-type photodiode associated with an NMOS transfer transistor, the preferred embodiment is that described in relation with FIG. 3 with NMOS-type transfer and reset transistors, a PMOS-type readout transistor of decreased dimensions, and a PMOS-type selection transistor.

Although the use of a pinned photodiode of a type opposite to that shown in FIG. 3 is relatively uncommon, one could have an N+/P/N photodiode, on an N-type substrate, associated with a PMOS-type transfer transistor. In this case, it could be envisaged to only have PMOS-type transistors, the readout transistors having decreased dimensions with the transfer and reset transistors, and preferably, with respect to the selection transistor. Further, in the case of such an N+/P/N photodiode, the cathode would be connected to high reference potential VDDH and the anode would be connected to the transfer transistor.

Further, although the above-mentioned examples show transfer and reset transistors of the same type, those could be different. However, for density reasons and also to limit the surface areas of wells capable of creating parasitic diodes, the use of a same type of transistors will be preferred.

Further, the described embodiments are not limited to the numerical examples of bias potentials mentioned hereabove.

Further, the described embodiments are not limited to the specific case described hereabove, where the photodiode is a pinned diode.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A CMOS image sensor comprising at least one pixel comprising:
a photodiode having a first terminal connected to a node of application of a first reference potential;
a first MOS transistor connecting a second terminal of the photodiode to a sense node of the pixel;
a second MOS transistor connecting the sense node to a node of application of a second reference potential; and
a third MOS transistor assembled as a source follower having its gate connected to the sense node and having its source intended to be connected to a readout circuit,
the first, second, and third transistors having a same gate insulator thickness,
wherein the third transistor has a gate length smaller than the gate lengths of the first and second transistors and/or a gate width smaller than the gate widths of the first and second transistors, wherein the difference between the first and second reference potentials is greater than the maximum voltage which may be applied between two terminals of the third MOS transistor, and wherein the body region or the drain region of the third transistor is connected to a node of application of a third reference potential between the first and second potentials,
the sensor being formed with a technological process enabling to form on a same chip MOS transistors having a first gate insulator thickness and MOS transistors having a second gate insulator thickness greater than the first thickness, wherein the first, second, and third transistors have the second gate insulator thickness.

2. The sensor of claim 1, wherein the body region of the third transistor is insulated from the body region of the first transistor and the third reference potential applied to the body region of the third transistor is different from the potential applied to the body region of the first transistor.

3. The sensor of claim 2, wherein the first, second, and third transistors are N-channel transistors, the body regions of the first and second transistors being connected to the node of application of the first reference potential, the body region of the third transistor being connected to the node of application of a fourth reference potential, and the drain region of the third transistor being connected to a node of application of a fifth reference potential.

4. The sensor of claim 1, wherein the third transistor is a P-channel transistor.

5. The sensor of claim 4, wherein first and second transistors are N-channel transistors, the body regions of the first and second transistors being connected to the node of application of the first reference potential, the body region of the third transistor being connected to the node of application of the second reference potential, and the drain region of the third transistor being connected to the node of application of the third reference potential.

6. The sensor of claim 1, wherein said at least one pixel further comprises a fourth MOS transistor connecting the source of the third transistor to an output track of the pixel.

7. The sensor of claim 6, wherein the fourth transistor has a gate length greater than that of the third transistor and/or a gate width greater than that of the third transistor.

8. The sensor of claim 6, wherein the fourth transistor is a transistor of same conductivity type as the third transistor.

9. The sensor of claim 1, wherein the photodiode is a pinned diode comprising an N-type doped storage region, formed in a P-type doped substrate, and a P-type doped layer coating the storage region, said layer having a higher doping level than the substrate.

10. The sensor of claim 1, further comprising a peripheral control circuit comprising at least one MOS transistor having a gate insulator thickness smaller than that of the first, second, and third transistors.

11. A CMOS image sensor comprising at least one pixel comprising:
a photodiode having a first terminal connected to a node of application of a first reference potential;
a first MOS transistor connecting a second terminal of the photodiode to a sense node of the pixel;
a second MOS transistor connecting the sense node to a node of application of a second reference potential; and
a third MOS transistor assembled as a source follower having its gate connected to the sense node and having its source intended to be connected to a readout circuit,
the first, second, and third transistors having a same gate insulator thickness,
wherein the third transistor has a gate length smaller than the gate lengths of the first and second transistors and/or a gate width smaller than the gate widths of the first and second transistors, wherein the difference between the first and second reference potentials is greater than the maximum voltage which may be applied between two terminals of the third MOS transistor, and wherein the body region or the drain region of the third transistor is connected to a node of application of a third reference potential between the first and second potentials, the sensor further comprising a peripheral control circuit comprising at least one MOS transistor having a gate insulator thickness smaller than that of the first, second, and third transistors.

12. A CMOS image sensor comprising at least one pixel comprising:
- a photodiode having a first terminal connected to a node of application of a first reference potential;
- a first MOS transistor connecting a second terminal of the photodiode to a sense node of the pixel;
- a second MOS transistor connecting the sense node to a node of application of a second reference potential; and
- a third MOS transistor assembled as a source follower having its gate connected to the sense node and having its source intended to be connected to a readout circuit, the first, second, and third transistors having a same gate insulator thickness, wherein the third transistor has a gate length smaller than the gate lengths of the first and second transistors and/or a gate width smaller than the gate widths of the first and second transistors, wherein the difference between the first and second reference potentials is greater than the maximum voltage which may be applied between two terminals of the third MOS transistor, and wherein the body region or the drain region of the third transistor is connected to a node of application of a third reference potential between the first and second potentials, wherein said at least one pixel further comprises a fourth MOS transistor connecting the source of the third transistor to an output track of the pixel, wherein the fourth transistor has a gate length greater than that of the third transistor and/or a gate width greater than that of the third transistor.

13. The sensor of claim 12, wherein the fourth transistor is a transistor of same conductivity type as the third transistor.

* * * * *